(12) United States Patent
Heerlein et al.

(10) Patent No.: US 7,782,010 B2
(45) Date of Patent: Aug. 24, 2010

(54) SMD BATTERY CONTACT MODULE

(75) Inventors: Markus Heerlein, Singapore (SG); Thomas Kasztelan, Erlangen (DE); Vincent Ong, Singapore (SG)

(73) Assignee: Siemens Audiologische Technik GmbH, Erlangen (DE)

( * ) Notice: Subject to any disclaimer, the term of this patent is extended or adjusted under 35 U.S.C. 154(b) by 576 days.

(21) Appl. No.: 11/810,969

(22) Filed: Jun. 7, 2007

(65) Prior Publication Data

US 2007/0293081 A1    Dec. 20, 2007

(30) Foreign Application Priority Data

Jun. 8, 2006   (DE) .................. 10 2006 026 753

(51) Int. Cl.
*H02J 7/00*     (2006.01)
*H04R 25/00*    (2006.01)

(52) U.S. Cl. ................. 320/107; 320/DIG. 26; 381/324

(58) Field of Classification Search .......... 320/106, 320/107, 112, 113, DIG. 26; 439/500, 653, 439/736; 381/68, 312, 322, 324
See application file for complete search history.

(56) References Cited

U.S. PATENT DOCUMENTS

| | | | |
|---|---|---|---|
| 3,828,142 A * | 8/1974 | Buttner .................... 381/323 |
| 4,447,677 A * | 5/1984 | Miyahra et al. ............. 381/324 |
| 6,058,198 A * | 5/2000 | Aceti et al. ................ 381/323 |
| 6,456,720 B1 * | 9/2002 | Brimhall et al. ............ 381/324 |
| 7,260,233 B2 * | 8/2007 | Svendsen et al. ........... 381/322 |
| 2003/0199204 A1 | 10/2003 | Sauer et al. |
| 2005/0078843 A1 * | 4/2005 | Bauman ..................... 381/312 |
| 2006/0104467 A1 * | 5/2006 | Aeschlimann et al. ...... 381/328 |
| 2007/0036374 A1 * | 2/2007 | Bauman et al. ............ 381/312 |
| 2007/0177749 A1 * | 8/2007 | Sjursen et al. ............. 381/323 |

FOREIGN PATENT DOCUMENTS

| | | |
|---|---|---|
| DE | 102 14 542 C1 | 11/2003 |
| DE | 102 61 733 B4 | 7/2005 |

* cited by examiner

*Primary Examiner*—Edward Tso
*Assistant Examiner*—M'Baye Diao

(57) ABSTRACT

The production of hearing apparatuses and in particular of hearing devices is to be simplified. To this end, a battery contact module with an electrical contact facility and a plastic frame is proposed, to/in which the contact facility is fastened. In this way, the battery contact module is designed as a SMD component and the contact facility has corresponding connections for a surface mounting on a printed circuit board. An amplifier printed circuit board can herewith be advantageously automatically equipped with the battery contact module and soldered.

15 Claims, 2 Drawing Sheets

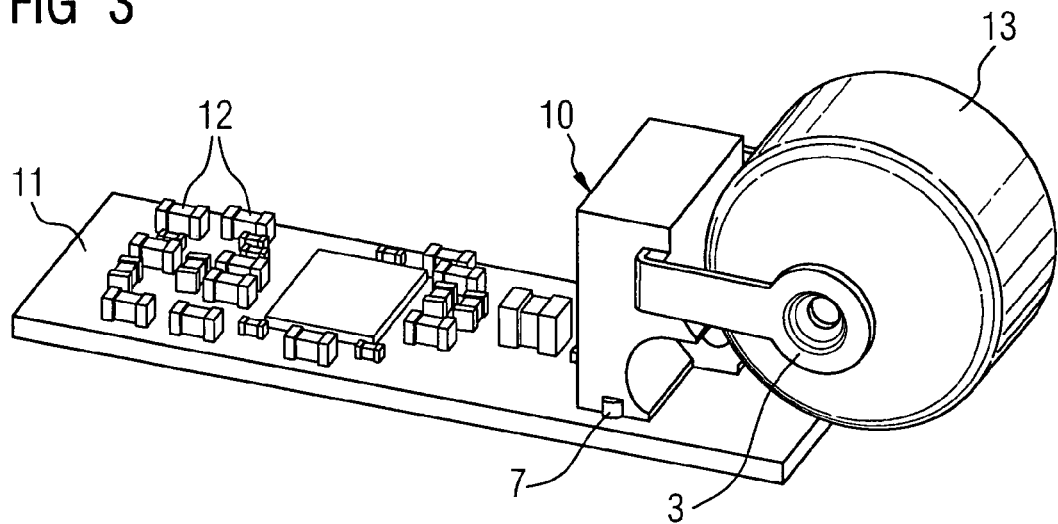
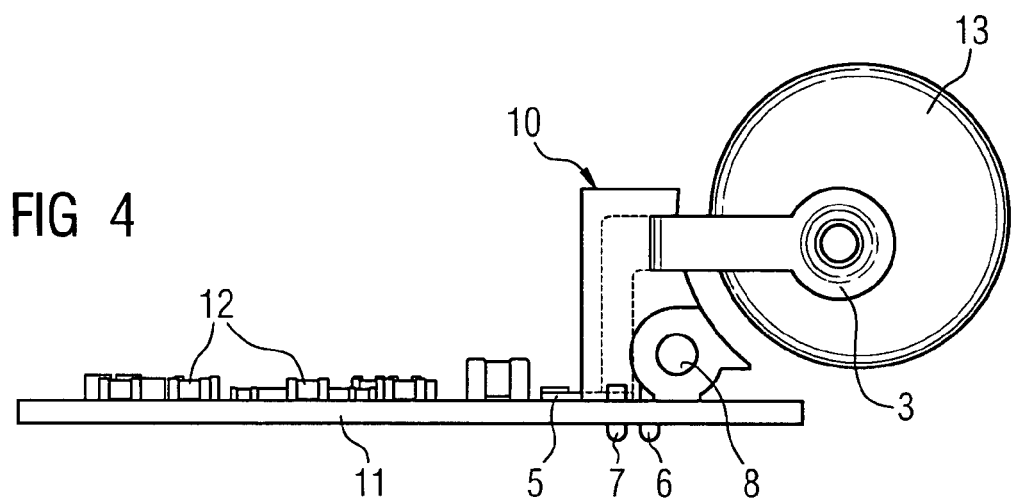
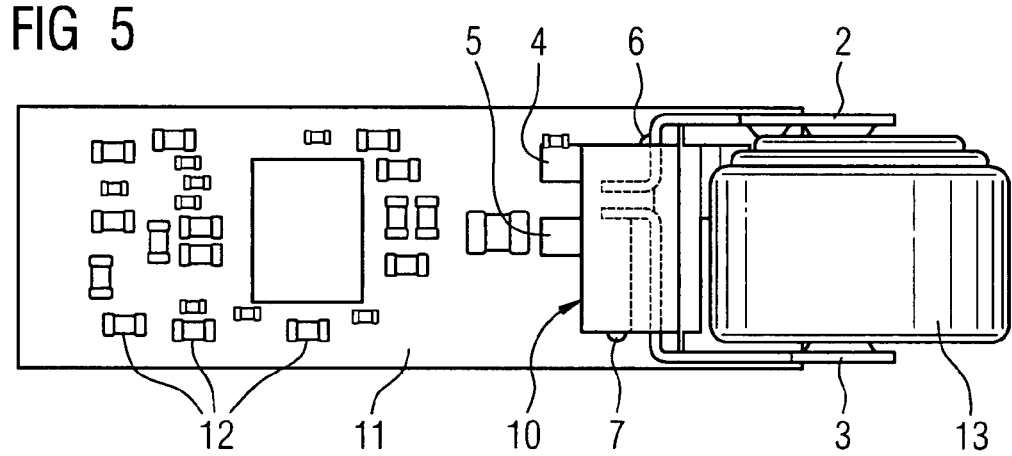

ic at least on its surface. It is thus advantageous if the material does not adsorb or absorb steam and/or water. In particular, it is favorable if the material is non-porous. This herewith prevents the battery contact module from being damaged if it is exposed to high temperatures during soldering for instance.
SMD BATTERY CONTACT MODULE

CROSS REFERENCE TO RELATED APPLICATIONS

This application claims priority of German application No. 10 2006 026 753.2 filed Jun. 8, 2006, which is incorporated by reference herein in its entirety.

FIELD OF THE INVENTION

The present invention relates to a battery contact module for a hearing apparatus having an electrical contact facility and a plastic frame, onto/into which the contact facility is fastened. In particular, the present invention relates to a battery contact module for a hearing device. A battery contact module of this type can however also be used for headsets, earphones and suchlike.

BACKGROUND OF THE INVENTION

Power is typically supplied to a hearing device by way of a battery. This is generally linked to a printed circuit board by way of a contact facility. The contact facility consists here of battery contacts, which are positioned in a frame by hand. The production expenditure is correspondingly high.

Furthermore, the battery contacts are generally fastened to the printed circuit board by way of so-called traversing bores. In this case, it is no longer possible or only possible to a restricted degree to fit the printed circuit board with components on both sides.

DE 102 14 542 C1 discloses a contact facility for a battery for installation in an in-the-ear hearing device. The contact apparatus consists of an injection-molded part, into which metal contact springs are inserted using so-called 'insert mold technology'. Furthermore, wire elements are attached to the injection-molded part as conductors.

The further publication DE 102 61 733 B4 shows a connector with a rolled sleeve. In particular, this can be a battery contact connector implemented in SMD design. The housing of the connector is made from LCP plastic.

SUMMARY OF THE INVENTION

The object of the present invention consists in simplifying the production of a hearing apparatus.

In accordance with the invention, this object is achieved by a battery contact module for a hearing apparatus having an electrical contact facility and a plastic frame, onto/into which the contact facility is fastened, with the battery contact module being designed as an SMD component and the contact facility comprising corresponding connections for a surface mounting. It is thus possible to dispense with a special manufacturing device for the individual battery contacts for the subassembly of an amplifier. Furthermore, the plastic frame has a bore or a projecting assembly element, with which the battery contact module can be fastened to a housing of the hearing apparatus. If the battery contact module is then soldered to a printed circuit board, the whole printed circuit board is able to be fastened to the housing by way of this fastening possibility. Furthermore, a distinct reference of the printed circuit board to control elements is given with this fastening.

Furthermore, the plastic frame features at least one guiding pin or a guiding bore, in order to fix the battery contact module to a printed circuit board during production. These guiding elements are used in particular to prevent the battery contact module from changing its position during soldering. It is therefore possible to dispense with special retaining frames for the subassembly.

In accordance with the invention, it is thus also possible to mechanically attach a battery contact module to a printed circuit board. This allows the production costs for the hearing apparatus and in particular for a hearing device to be further reduced.

The material of the plastic frame is preferably not hygroscopic at least on its surface. It is thus advantageous if the material does not adsorb or absorb steam and/or water. In particular, it is favorable if the material is non-porous. This herewith prevents the battery contact module from being damaged if it is exposed to high temperatures during soldering for instance.

It is furthermore particularly advantageous if the plastic frame is temperature-resistant such that it can be exposed to a temperature of at least 250° C. for at least two seconds without deforming. In particular, the plastic frame is to be able to be exposed to a temperature of 260° C. for three seconds. The SMD battery contact module can herewith survive a reflow soldering process undamaged. A particularly suitable plastic for this purpose would be a liquid crystal polymer.

The contact facility of the battery contact module according to the invention can be injected into the plastic frame. The production expenditure of the battery contact module can herewith also be reduced.

The contact facility can comprise two metal springs made of rust-resistant steel. Adequate contact pressure can herewith always be exerted on the battery contacts.

BRIEF DESCRIPTION OF THE DRAWINGS

The present invention is now described in more detail with reference to the appended drawings, in which;

FIG. 3 shows the battery contact module installed on an SMD printed circuit board with a battery;

FIG. 4 shows a side view of the printed circuit board assembly in FIG. 3; and

FIG. 5 shows the top view of the printed circuit board assembly in FIG. 3.

DETAILED DESCRIPTION OF THE INVENTION

The exemplary embodiment illustrated in more detail below represents a preferred embodiment of the present invention.

Figure 1:
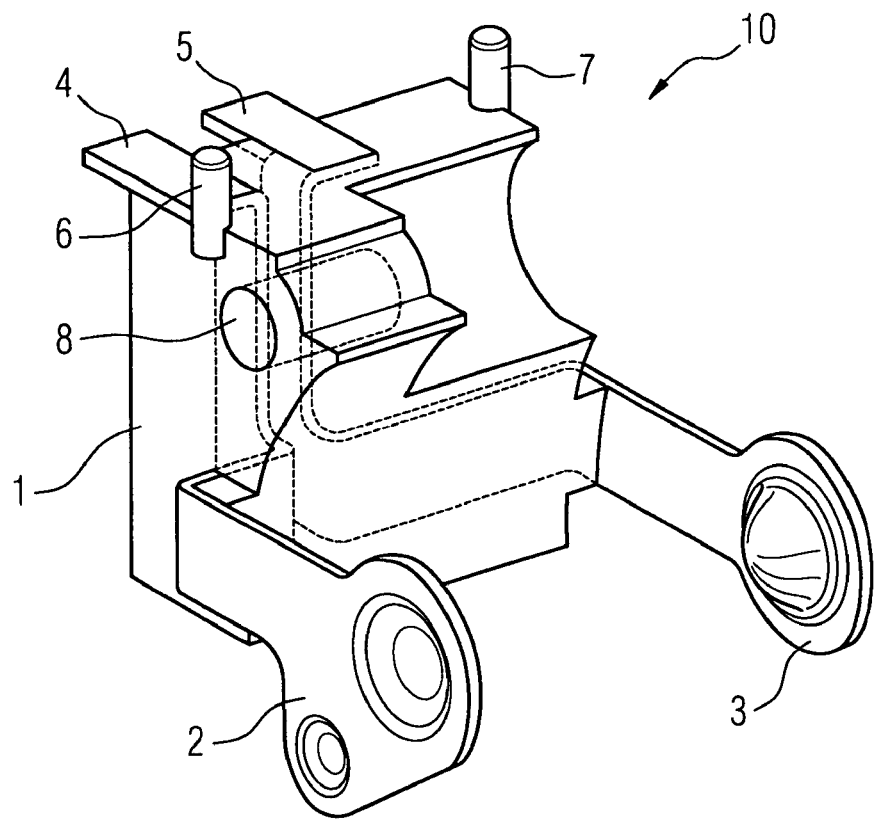
FIG. 1 shows a front view of the battery contact module.

The inventive battery contact module 10 reproduced in FIG. 1 features a frame 1, which is injected from a plastic. Two contact springs 2 and 3 made of rust-resistant steel are injected into the frame 1. These contact springs 2 and 3 are used to contact the positive pole and the negative pole of a battery. At their different ends in each instance, they project from the plastic frame 1 and form there a so-called SMD contact pad 4,5 in each instance. These contact pads 4, 5 can be soldered onto a printed circuit board in a reflow process.

Two pins 6, 7 are furthermore injected onto the frame, said pins being used so that an SMD pick and place machine can insert the battery contact module into a printed circuit board, so that the position does not change during the reflow soldering process. This additional orientation aid allows the module to be directly assembled on the printed circuit board by way of a 'pick and place'.

An assembly element with a bore 8 is also injected onto the frame 1, with which the battery contact module 10 can be fastened to a housing of a hearing device.

Figure 2:
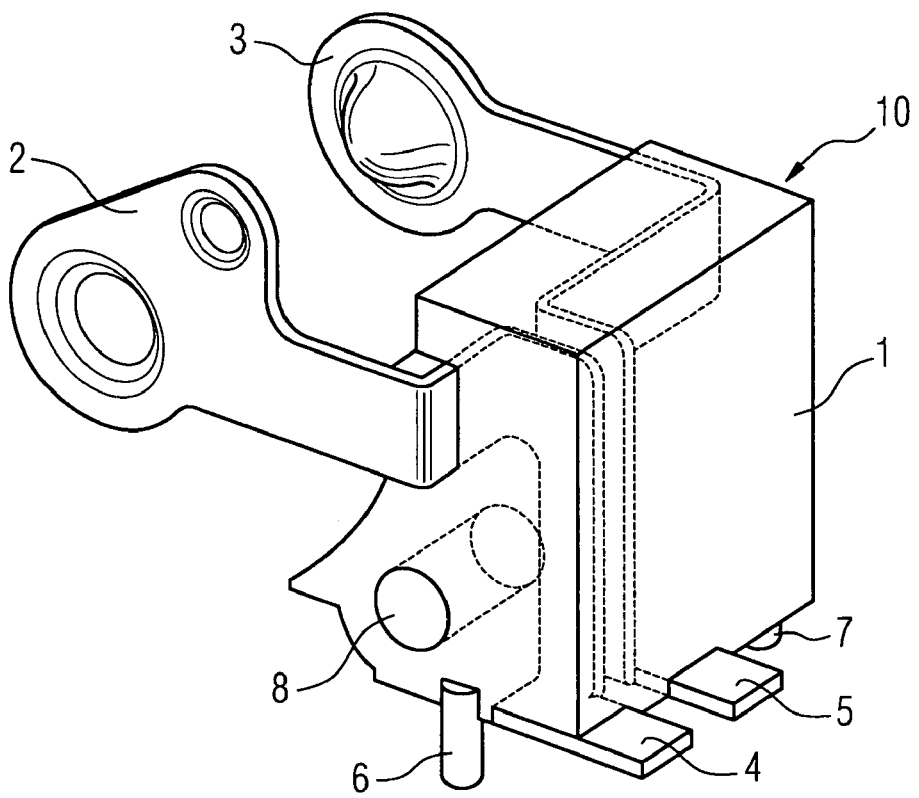
FIG. 2 shows a rear view of the battery contact module in FIG. 1.

FIG. 2 shows a rear view of the battery contact module in FIG. 1, with it also being rotated in its assembly position, in which the guiding pins 6, 7 and the SMD contact pads 4, 5 are arranged below.

FIG. 3 shows the battery contact module 10 soldered onto a printed circuit board 11. The printed circuit board is also equipped with numerous SMD components 12. A battery 13 is mounted in the contact springs 2, 3 of the battery contact module 10. The guiding pins 6, 7 of the battery contact module 10 protrude through corresponding bores in the printed circuit board 11.

The whole design shown in FIG. 3 represents the amplification unit of a hearing device and can be seen in the side view in FIG. 4. In this perspective, it is possible to easily recognize the guiding pins 6, 7 and how they penetrate the printed circuit board 11, so that this is fixed laterally for the soldering process. The bore 8 can also be easily identified in this diagram, with which the battery contact module 10 can be fastened to a hearing device housing. Provided the printed circuit board is soldered with the battery contact module 10, the bore 8 is also used indirectly to fix the printed circuit board 11 in the hearing device housing.

In particular, the top view onto the amplification unit in FIG. 5 also shows the SMD contact pads 4, 5, with which the battery contact module 10 is soldered onto the printed circuit board 11. For the reflow soldering, the SMD contact pads 4, 5 are aligned flush with the surface of the printed circuit board 11.

To ensure that the battery contact module survives the reflow soldering process undamaged, the plastic frame 1 consists of an injectable plastic, which, in a hardened state, does not absorb any water, i.e. is not hydroscopic. If water were namely to be found in the plastic, as may be the case for instance with porous materials, said plastic would thus crack with the high temperatures in the reflow oven. To prevent damages in this regard, the plastic frame 1 is preferably injected from a liquid crystal polymer (LCP), which does not absorb steam in the solidified state. Furthermore, the liquid crystal polymer of the plastic frame 1 features the characteristic that it can be exposed to the reflow oven temperature of up to 260° C. for two to three seconds without resulting in deformations.

By means of the battery contact element used, battery contacts can no longer be positioned in the frame by hand, thereby saving on assembly time. Fitting an amplifier circuit board with components for a hearing device with this battery contact module can also be carried out by means of an SMD machine.

A further advantage of the SMD battery contact module consists in no traversing bores having to be provided on the printed circuit board for the individual battery contacts. Fitting the printed circuit board with components on both sides as well as improving the design of said printed circuit board and reducing its size is thus possible. Furthermore, the SMD battery contact module also allows a special manufacturing receptacle to be dispensed with, which is used for the subassembly of the amplifier. For the sake of completeness, it should finally be mentioned that the manual soldering of the battery contacts with the SMD battery contact module according to the invention is no longer possible, as a result of which production time can be saved.

The invention claimed is:

1. A battery contact module for a hearing apparatus, comprising:
   a plastic frame comprising:
      an assembly element for fastening the battery contact module to a housing of the hearing apparatus, and
      a guiding unit for fixing the battery contact module on a printed circuit board during production; and
   an electrical contact unit fastened to the plastic frame,
   wherein the battery contact module is configured to be a surface mounted device (SMD) battery contact module and the electrical contact unit comprises a corresponding connection for surface mounting the battery contact module on the printed circuit board, and
   wherein the plastic frame does not deform after exposing to a temperature of at least 250° C. for at least two seconds.

2. The battery contact module as claimed in claim 1, wherein a material of the plastic frame is not hygroscopic at least on a surface of the material.

3. The battery contact module as claimed in claim 2, wherein the material is non-porous.

4. The battery contact module as claimed in claim 1, wherein the plastic frame is temperature-resistant.

5. The battery contact module as claimed in claim 1, wherein a material of the plastic frame is a liquid crystal polymer.

6. The battery contact module as claimed in claim 1, wherein the electrical contact unit is injected into the plastic frame.

7. The battery contact module as claimed in claim 1, wherein the electrical contact unit comprises two metal springs made of rust-resistant steel.

8. The battery contact module as claimed in claim 1, wherein the assembly element is a bore or a projecting assembly element.

9. The battery contact module as claimed in claim 1, wherein the guiding unit is a guiding pin or a guiding bore.

10. A hearing apparatus, comprising:
    a housing of the hearing apparatus; and
    a battery contact module comprising:
       a plastic frame comprising:
          an assembly element for fastening the battery contact module to the housing of the hearing apparatus, and
          a guiding unit for fixing the battery contact module on a printed circuit board during production, and
       an electrical contact unit fastened to the plastic frame,
       wherein the battery contact module is configured to be a surface mounted device (SMD) battery contact module and the electrical contact unit comprises a corresponding connection for surface mounting the battery contact module on the printed circuit board, and
       wherein the plastic frame does not deform after exposing to a temperature of at least 250° C. for at least two seconds.

11. The hearing apparatus as claimed in claim 10, wherein the assembly element is a bore or a projecting assembly element.

12. The hearing apparatus as claimed in claim 10, wherein the guiding unit is a guiding pin or a guiding bore.

13. A method for manufacturing a battery contact module for a hearing apparatus, comprising:
    making a plastic frame comprising:
       an assembly element for fastening the battery contact module to a housing of the hearing apparatus, and
       a guiding unit for fixing the battery contact module on a printed circuit board during production; and
    fastening an electrical contact unit to the plastic frame, wherein the battery contact module is a surface mounted device (SMD) battery contact module and the electrical contact unit comprises a corresponding connection for surface mounting the battery contact module on the printed circuit board, and wherein the plastic frame does not deform after exposing to a temperature of at least 250° C. for at least two seconds.

14. The method as claimed in claim 13, wherein the assembly element is a bore or a projecting assembly element.

15. The method as claimed in claim 13, wherein the guiding unit is a guiding pin or a guiding bore.

* * * * *